United States Patent
Bruel et al.

(10) Patent No.: US 6,190,998 B1
(45) Date of Patent: Feb. 20, 2001

(54) METHOD FOR ACHIEVING A THIN FILM OF SOLID MATERIAL AND APPLICATIONS OF THIS METHOD

(75) Inventors: Michel Bruel, Veurey; Bernard Aspar, Rives, both of (FR)

(73) Assignee: Commissariat a l'Energie Atomique, Paris (FR)

(*) Notice: Under 35 U.S.C. 154(b), the term of this patent shall be extended for 0 days.

(21) Appl. No.: 09/147,266

(22) PCT Filed: May 13, 1997

(86) PCT No.: PCT/FR97/00842

§ 371 Date: Nov. 16, 1998

§ 102(e) Date: Nov. 16, 1998

(87) PCT Pub. No.: WO97/43461

PCT Pub. Date: Nov. 20, 1997

(30) Foreign Application Priority Data

May 15, 1996 (FR) .................................................. 96 06085

(51) Int. Cl.[7] .......................... H01L 21/76; H01L 21/30; H01L 21/31; H01L 21/469
(52) U.S. Cl. .......................... 438/407; 438/455; 438/459; 438/766
(58) Field of Search ..................................... 438/407, 455, 438/459, 766, 798

(56) References Cited

U.S. PATENT DOCUMENTS

| 4,368,083 | 1/1983 | Bruel et al. . |
| 4,452,644 | 6/1984 | Bruel et al. . |
| 5,374,564 | * 12/1994 | Bruel ...................................... 437/24 |
| 5,494,835 | 2/1996 | Bruel . |
| 5,559,043 | 9/1996 | Bruel . |
| 5,714,395 | 2/1998 | Bruel . |
| 5,994,207 | * 11/1999 | Henley et al. ........................ 438/515 |

* cited by examiner

*Primary Examiner*—Amit Zarabian
*Assistant Examiner*—Adam Pronin
(74) *Attorney, Agent, or Firm*—Oblon, Spivak, McClelland, Maier & Neustadt, P.C.

(57) ABSTRACT

A method for making a thin film of solid material, including bombarding one face of a substrate of the solid material with at least one of rare gas ions and hydrogen gas ions so as to create a layer of microcavities seperating the substrate into two regions at a depth neighboring the average ion penetration depth, and heating the layer of microcavities to a temperature sufficient to bring about a separation between the two regions of the substrate. The solid material includes one of a dielectric material, a conducting material, a semi-insulating material, and an unorganized semiconducting material.

18 Claims, 3 Drawing Sheets

METHOD FOR ACHIEVING A THIN FILM OF SOLID MATERIAL AND APPLICATIONS OF THIS METHOD

CROSS-REFERENCE TO RELATED APPLICATIONS

This application is a national stage filing under 35 U.S.C. §371 of PCT/FR97/00842 filed May 13, 1997.

BACKGROUND OF THE INVENTION

1. Field of the Invention

The present invention concerns a method for achieving a thin film of solid material, this material possibly being a dielectric, a conductor or a semi-insulator. It may be crystalline or noncrystalline. It may consist of an amorphic or polycrystalline semiconductor whose crystallographic planes are oriented in any direction whatsoever. This material may have ferroelectric, piezoelectric, magnetic, electro-optic properties, etc.

A particularly interesting application of the method according to the invention concerns the achievement of ferroelectric capacitor memories.

2. Description of the Background

Various methods are known to achieve thin films of solid material. These methods depend on the nature of the material and the thickness of the film desired. For instance, it is possible to deposit thin films of a solid material on the surface of a piece by projection, spraying, electroplating, etc. A thin film may also be obtained by thinning a plate of the material desired by mechanical-chemical or chemical abrasion, the thin film obtained then being bonded or fixed on a piece serving as a support.

In general, a thin film is fixed on the surface of a piece so as to modify the properties of the piece superficially.

In the semiconductor field, it is also sometimes necessary to achieve thin semiconducting films, for example to manufacture so-called "silicon-on-insulator" substrates. Various techniques to achieve thin semiconducting films have been developed. One of the most recent techniques is based on the fact that the implantation of rare gas or hydrogen ions in a semiconducting material induces the formation of embrittled areas at a depth neighbouring the average ion penetration depth. Document FR-A-2 681 472 discloses a method which makes use of this property to obtain a thin film of semiconducting material. According to this method, a plate of the semiconducting material desired comprising a flat face is subjected to the following steps:

a first implantation step wherein the flat face of the plate is bombarded with ions, thus creating, within the plate body and at a depth neighbouring the ion penetration depth, a "gaseous microblister" layer separating the plate into a lower region making up the mass of the substrate and an upper region making up the thin film, the ions being chosen among rare gas or hydrogen gas ions;

a second step wherein the flat face of the plate is placed in close contact with a support made up of at least a layer of rigid material. This close contact being achieved, for example, using an adhesive substance or through the effect of a prior preparation of the surfaces and possibly a heat and/or electrostatic treatment to favour the atomic bonds between the support and the plate;

a third heat treatment step wherein the plate-support assembly is heated to a temperature higher than the temperature at which the implantation was performed and sufficient to create a separation between the thin film and the mass of the substrate. This temperature is higher than or equal to approximately 400° C. for silicon.

This implantation is suited to create a layer of gaseous microblisters which will result in a rupture area at the end of the heat treatment. The layer of microblisters thus created in the plate body, at a depth neighbouring the average ion penetration depth, delimits two regions in the plate body separated by this layer: a region intended to make up the thin film and a region forming the rest of the substrate. During the third step, the heat treatment is performed at a temperature sufficient to create the rupture area and the separation between the two regions through a crystalline rearrangement effect in the semiconducting material, for example through a microcavity growth effect and/or a microblister pressure effect.

Depending on the implantation conditions, following the implantation of a gas such as hydrogen for example, cavities or microblisters may or may not be observed with a transmission electron microscope. In the case of silicon, microcavities of sizes ranging from a few nm to a few hundred nm may be present. As a result, these cavities are only observable in the heat treatment step, particularly when the implantation temperature is low, and nucleation is therefore performed during this step so as to obtain the rupture between the thin film and the rest of the substrate at the end of the heat treatment.

Until now, it was believed that the method disclosed in document FR-A-2 681 472 could only be applied to achieve a thin film using a substrate of semiconducting material. This document provides the following explanation to the various phenomena known from experience. First of all, the first ion implantation step is carried out by exposing a flat face of a plate of semiconducting material to a beam of ions, the plane of this flat face being either substantially parallel to a main crystallographic plane in the case where the semiconducting material is perfectly monocrystalline, or slightly inclined with respect to a main crystallographic plane with the same index for all grains in the case where the material is polycrystalline. This leads to the creation, in the plate body at a depth neighbouring the average ion penetration depth, of a layer of "gaseous microblisters" corresponding to embrittlement areas and delimiting, in the plate body, two regions separated by this layer: a region intended to make up the thin film and a region forming the rest of the substrate. The term "gaseous microblisters" refers to any cavity or microcavity generated by the implantation of hydrogen gas or rare gas ions in the material. The cavities may have either a very flat shape, i.e. with a small height, for example in the order of a few atomic gaps, or a substantially spherical shape or any other shape different from the two previous shapes. These cavities may or may not contain a free gaseous phase and/or gas atoms derived from implanted ions fixed to atoms of the material forming the walls of the cavities. These cavities are generally referred to as "microblisters", "platelets or even " "bubbles". During the third step, the heat treatment is performed at a temperature sufficient (for the duration of the treatment applied) to create the separation between the two regions. The time-temperature pair of the heat treatment depends of the dose of implanted ions.

The method described in document FR-A-2 681 472 concerns the achievement of a thin film using a substrate of semiconducting material having a crystalline structure. The development of the various steps of the method has been explained as resulting from the interaction between the implanted ions and the crystalline mesh of the semiconducting material.

However, the inventors of the present invention were surprised to discover that this method could be applied to all types of solid materials, crystalline or noncrystalline. This method may be applied to dielectric, conducting, semi-insulating materials, as well as to amorphic semiconducting materials and even polycrystalline semiconductors whose grains do not have main crystallographic planes substantially parallel to the flat face of the plate. The latter, along with amorphic semiconductors, will be referred to as unorganized semiconductors hereinafter. Furthermore, this method does not significantly modify the properties of the material it is applied to.

The inventors of the present invention were surprised to discover that the implantation of hydrogen gas or rare gas ions may also bring about the formation of microcavities in solid materials other than a crystalline semiconducting material, and that a subsequent heat treatment may bring about the separation, at the microcavities, of the mass of the material into two parts. Indeed, the heat treatment induces, regardless of the type of solid material, the microcavities to coalesce, which leads to an embrittlement of the structure at the layer of microcavities. This embrittlement enables the separation of the material under the effect of internal stresses and/or pressure within the microcavities, this separation being natural or assisted by external stresses.

The term layer of microcavities refers to an area containing microcavities possibly located at different depths and adjacent or not adjacent to one another.

SUMMARY OF THE INVENTION

The object of the invention is therefore a method for achieving a thin film of solid material, crystalline or noncrystalline, chosen among a dielectric material, a conducting material, a semiinsulating material, an unorganized semiconducting material, characterised in that a substrate of said solid material is subjected to the following steps:

an ion implantation step during which one face of the substrate is bombarded with ions chosen among rare gas and hydrogen gas ions so as to create, in the body of the substrate at a depth neighbouring the average ion penetration depth, a layer of microcavities separating the substrate into two regions, a heat treatment step intended to heat the layer of microcavities to a temperature sufficient to bring about a separation between the two regions of the substrate, either naturally or by means of an applied stress.

It is possible to include, between the ion implantation step and the heat treatment step, a step wherein said face of the substrate is fixed on a support. This step may be necessary in the case where the thin layer is not sufficiently rigid on its own. It may be desired since the thin layer is generally intended to be placed on a support. In this case, the support must be able to withstand the final heat treatment step.

Said face of the substrate is fixed on the support by means of an adhesive substance or by means of a surface treatment favouring atomic bonds.

In particular, this method according to the invention may be applied to obtain a thin film of ferroelectric material using a substrate of ferroelectric material, and to fix it on a support.

Advantageously, the support being of semiconducting material, at least one electronic control circuit is elaborated on one face of this support and the thin film of ferroelectric material is fixed on the support so as to serve as a dielectric for a memory capacitor controlled by said electronic control circuit to thus make up a memory point.

The electronic control circuit is preferably of MOS transistor type.

The method according to the invention may also be applied to obtain a thin sapphire film on a support, a thin corrosion-resisting metal film on a support or a thin film of magnetic material on a support.

BRIEF DESCRIPTION OF THE DRAWINGS

The invention will be more clearly understood and further advantages and particularities will become apparent upon reading the description which follows, provided as a non-limiting example, made with reference to the attached drawings in which.

DETAILED DESCRIPTION OF THE PREFERRED EMBODIMENTS

The method according to the invention is applicable to the following crystalline or noncrystalline solid materials:

insulating or dielectric materials, conducting materials, unorganized semiconducting materials, semi-insulating materials, mainly those whose resistivity at ambient temperature is superior to approximately $10^7$ $\Omega.cm$, monocrystalline metals and superconductors in general.

It is thus possible, according to the invention, to achieve thin films of monocrystalline quartz using solid monocrystalline quartz. It is also possible to obtain thin films of magnetic, piezoelectric, ferroelectric, pyroelectric materials and materials having non-linear optical properties or electro-optic, acousto-optical effects.

A particular example will now be described: the achievement of ferroelectric capacitor memories on an integrated circuit.

Figure 1:
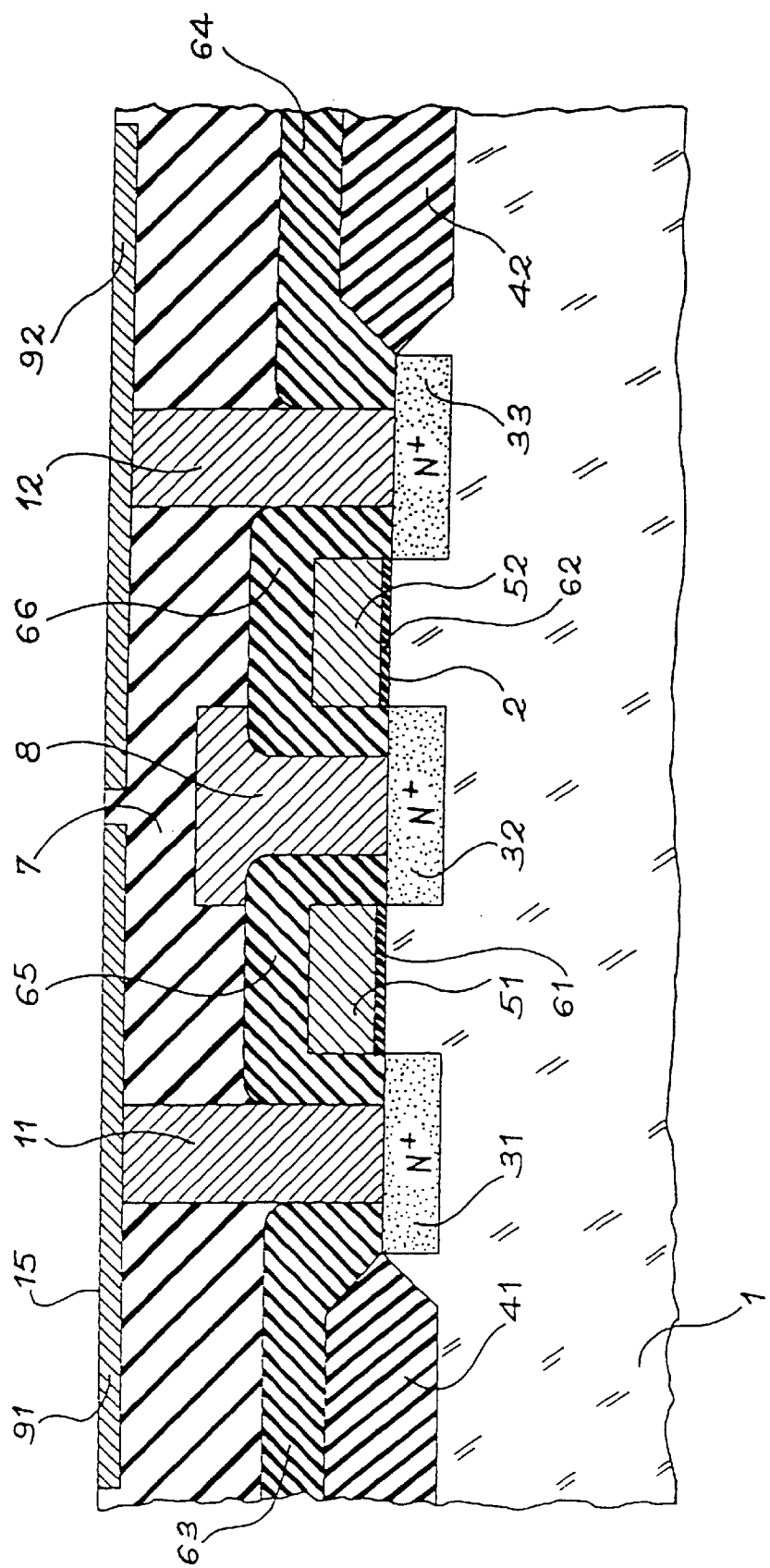
FIG. 1 is a partial cross-sectional view of an integrated circuit realized on one face of a semiconductor substrate.

The electronic circuit shown in the sectional view of FIG. 1 was achieved using current micro-electronic techniques. The so-called "plug" technique, the mechanical-chemical oxide planarization technique and the so-called "damask" technique making it possible to achieve connections imbedded in an oxide but flush with the surface of the oxide were implemented.

The circuit was elaborated on a face 2 of a substrate 1 of type P silicon. Implanted regions were realized on the face 2, only implanted regions 31, 32 and 33 of type N+being shown in this figure, and the field oxide was increased to obtain insulation areas 41 and 42 to the left of implanted region 31 and to the right of implanted region 33. Implanted regions 31 and 33 are intended to make up the drains of two MOS type transistors, implanted region 32 making up their common source. On the face 2, rows of polycrystalline silicon words 51 and 52 have been deposited and thin oxide layers 61 and 62 have been interposed. The rows of words 51 and 52 have been covered with layers of insulating material 65 and 66. This insulating material also covers areas 41 and 42 as layers 63 and 64. A row of aluminium bits 8 ensures the electrical contact with the source 32. An oxide layer 7 has been deposited to cover all the elements previously described. Flush platinum electrodes 91 and 92 provided with TiN barrier sub-layers are deposited in the oxide layer 7. The electrodes 91 and 92 are connected by "plugs" 11 and 12 to transistor drains 31 and 32. They are imbedded, the circuit then having a flat external face 15.

The achievement of a thin film of ferroelectric material according to the method of the present invention will now be described, this thin film being intended to form the capacitor dielectric.

Figure 2:
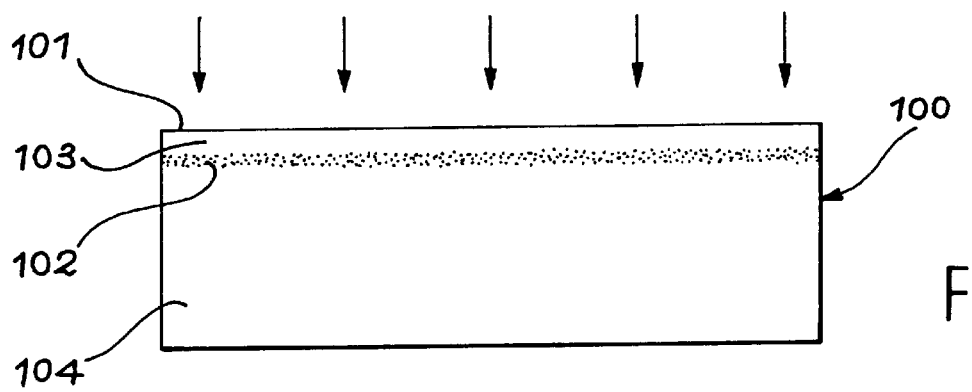
FIG. 2 illustrates the ion implantation step performed through one face of a substrate of ferroelectric material, according to the present invention.

FIG. 2 shows a side view of a substrate 100 of ferroelectric material, for example of $PbZrTiO_3$ (PZT). The flat face 101 of the substrate 100 is bombarded with ions, for example hydrogen ions at 200 keV and in a dose equal to $10^{17}$ cm$^{-2}$. The ion bombardment is indicated by arrows in FIG. 2. The implanted ions induce the formation of microcavities distributed in a layer 102 adjoining a plane parallel to the flat face 101, this plane being located at a distance from the flat face 101 corresponding to the average ion penetration depth. The layer 102 of implanted material has a very small thickness, in order of a few tens of nm, for example 50 to 100 nm. It separates the substrate 100 into two regions: a first region 103 located on the flat face 101 side and intended to form the thin film, and a second region 104 forming the rest of the substrate. The thickness of the region 103 is of approximately 800 nm. The layer 102 consists of a layer of microcavities.

Figure 3:
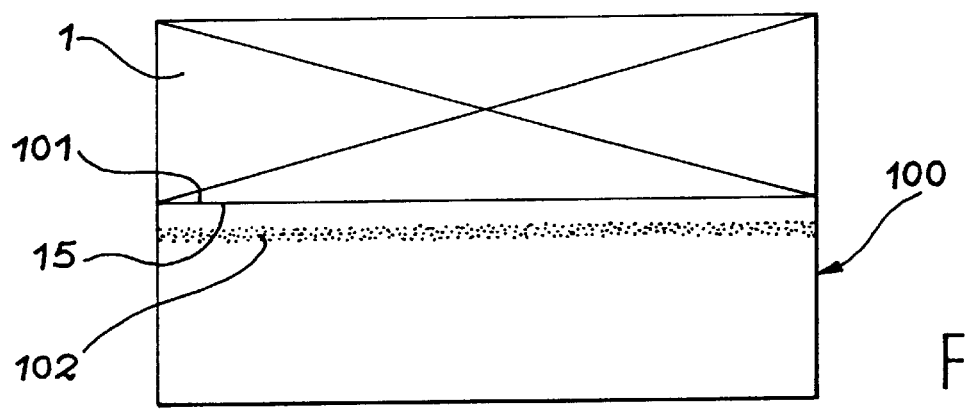
FIG. 3 illustrates the fixing step according to the present invention, which consists of making the face of the semiconductor substrate where the integrated circuit has been realized adhere to the face of the substrate of ferroelectric material which has been bombarded with ions.

The flat face 101 of the substrate of ferroelectric material 100 and the flat face 15 of the electronic circuit achieved on the semiconductor substrate 1 are treated, for example by a chemical process, so as to make them capable of adhering to one another when merely placed in contact. FIG. 3 shows the two substrates 100 and 1 associated, the flat face 15 of the semiconductor substrate 1 adhering to the flat face 101 of the substrate 100 of ferroelectric material.

Figure 4:
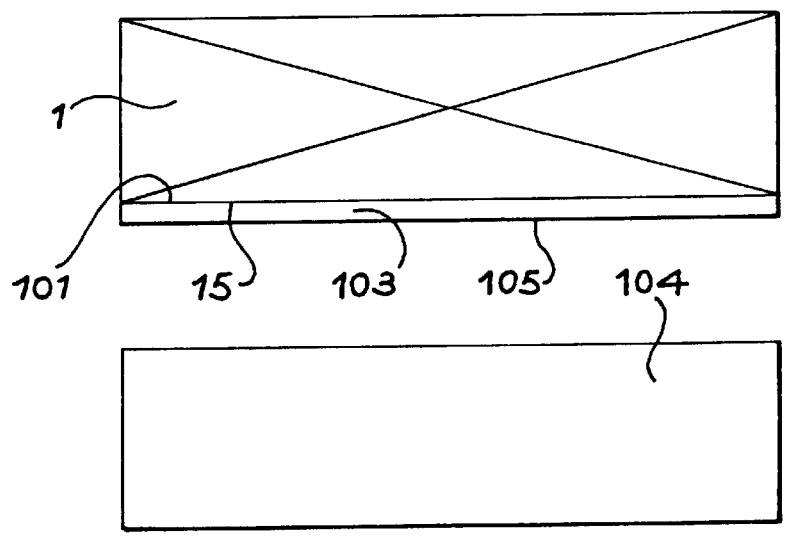
FIG. 4 illustrates the step of the method according to the invention leading to the separation of the thin film from the rest of the substrate of ferroelectric material.

The assembly is then heat treated at approximately 500° C., which results in inducing a separation of the two regions 103 and 104 of the substrate 100 of ferroelectric material at layer 102, as shown in FIG. 4. A semiconductor substrate provided with an electronic circuit with a thin film of ferroelectric material fixed to it is thus obtained.

The external face 105 of the thin film 103 may be finely polished.

Figure 5:
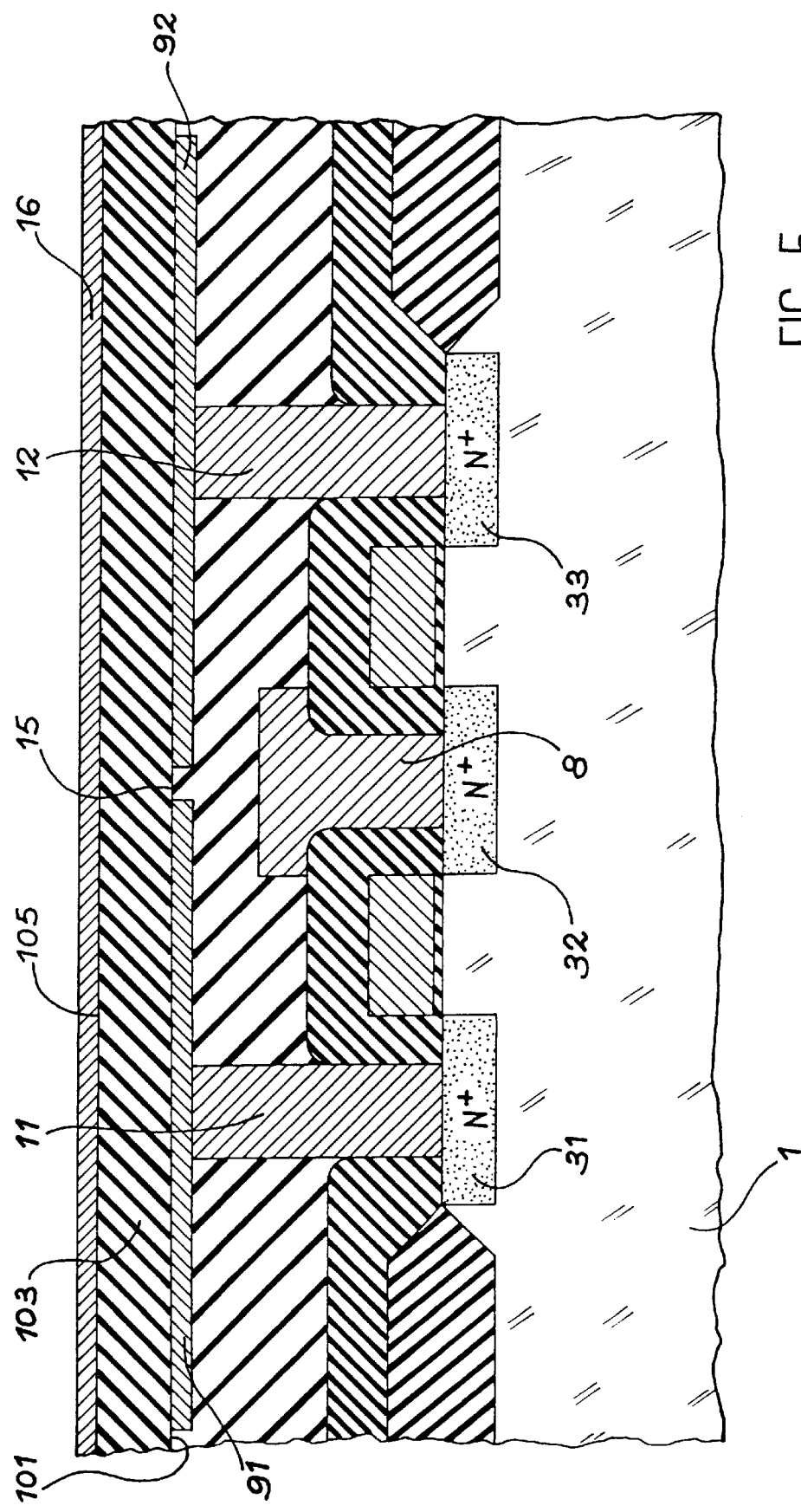
FIG. 5 is a partial sectional view of a ferroelectric capacitor memory point realized according to the present invention.

The device shown in FIG. 5 is obtained, in which a two-capacitor memory point is formed by depositing a common electrode 16 on the flat face 105 of the thin film 103.

A final packaging, may be added to protect the whole circuit.

Such a thin ferroelectric film may also be used to make up a layer of ferroelectric material deposited directly on the silicon to achieve MOS transistors in which the control gate is replaced with this ferroelectric layer whose polarization state determines the off or on-state of the transistor.

In particular, the application of the method according to the invention to dielectric materials makes it possible to achieve sapphire wear-resisting layers (β-alumina) on glass or silica supports. Such a thin alumina layer makes it possible to protect the glass or silica serving as a support, for example for optical components, from wear and scratches. An implantation of hydrogen ions at approximately $8 \times 10^{16}$ atoms/cm$^2$ and 110 keV makes possible a thin sapphire layer approximately 1 μm thick. This small thickness is compatible with a subsequent shaping of the glass or silica serving as the support so as to achieve lenses for example.

The method according to the invention is also applicable to metal materials. It makes it possible to achieve anticorrosive layers and diffusion barriers. The possibility of achieving monocrystalline metal layers instead of polycrystalline layers provides a significant advantage in terms of efficiency as a diffusion barrier against chemical aggressions and corrosion in particular. Indeed, the existence of important diffusion phenomena at the grain joints in polycrystalline materials limits the efficiency of the thin layers achieved in these materials. As an example, consider depositing a thin film of monocrystalline niobium 500 nm thick on a steel substrate to achieve objects intended to resist high temperatures in corrosive mediums. To obtain this thin film, an implantation of $H^+$ ions at approximately $2 \times 10^{17}$ atoms/cm$^2$ and 200 keV may be implemented.

Another example of an application concerns the achievement of memories using magnetic domains (bubbles) and magnetic domain walls (Block walls) to store the information. For this purpose, a solid substrate of non-magnetic garnet may be used on which a layer of ferrimagnetic garnet is developed by epitaxial growth. The method according to the invention makes it possible to add a thin layer of ferrimagnetic garnet material on a silicon substrate serving as a support and comprising integrated circuits. These integrated circuits combine electronic, logical, and analog devices, and integrated microwindings suited to generate localized magnetic fields to drive, displace and detect the magnetic domains or domain walls in the thin layer of ferrimagnetic garnet.

What is claimed as new and is desired to be secured by Letters Patent of the United States is:

1. A method for making a thin film of solid material, comprising the steps of:
    bombarding one face of a substrate of the solid material with at least one of rare gas ions and hydrogen gas ions so as to create a layer of microcavities separating the substrate into two regions at a depth neighboring the average ion penetration depth; and
    heating the layer of microcavities to a temperature sufficient to bring about a separation between the two regions of the substrate,
    wherein said solid material comprises one of a dielectric material, a conducting material, a semi-insulating material, and an unorganized semiconducting material.

2. A method according to claim 1, further comprising fixing said face of the substrate on a support between the bombarding step and the heating step.

3. A method according to claim 2, wherein said face of the substrate is fixed on the support by an adhesive substance.

4. A method according to claim 2, wherein said face of the substrate is fixed on the support by a treatment favoring atomic bonds.

5. A method according to claim 2, wherein:
    said solid material comprises ferroelectric material;
    the support comprises semiconducting material and includes at least one electronic control circuit elaborated on one face of the support; and
    the thin film of ferroelectric material is fixed on the support so as to serve as a dielectric for a memory capacitor controlled by said electronic control circuit to thus make up a memory point.

6. A method according to claim 5, wherein the electronic control circuit comprises a MOS transistor type circuit.

7. A thin sapphire film on a support made by the method according to claim 2.

8. A thin corrosion-resisting metal film on a support made by the method according to claim 2.

9. A thin film of magnetic material on a support made by the method according to claim 2.

10. A thin sapphire film on a support made by the method according to claim 2, wherein said face of the substrate is fixed on the support by at least one of an adhesive substance and a treatment favoring atomic bonds.

11. A thin corrosion-resisting metal film on a support made by the method according to claim 2, wherein said face of the substrate is fixed on the support by at least one of an adhesive substance and a treatment favoring atomic bonds.

12. A thin film of magnetic material on a support made by the method according to claim 2, wherein said face of the substrate is fixed on the support by at least one of an adhesive substance and a treatment favoring atomic bonds.

13. A method according to claim 1, wherein said solid material comprises ferroelectric material.

14. A thin sapphire film on a support made by the method according to claim 1.

15. A thin corrosion-resisting metal film on a support made by the method according to claim 1.

16. A thin film of magnetic material on a support made by the method according to claim 1.

17. A method according to claim 1, wherein the two regions of the substrate are separated naturally.

18. A method according to claim 1, wherein the two regions of the substrate are separated by applying stress.

* * * * *